United States Patent [19]
Monden

[11] Patent Number: 5,418,748
[45] Date of Patent: May 23, 1995

[54] BIT LINE LOAD CIRCUIT FOR SEMICONDUCTOR STATIC RAM

[75] Inventor: Junji Monden, Tokyo, Japan

[73] Assignee: NEC Corporation, Tokyo, Japan

[21] Appl. No.: 103,718

[22] Filed: Aug. 10, 1993

[30] Foreign Application Priority Data

Aug. 10, 1992 [JP] Japan .................................. 4-211911

[51] Int. Cl.⁶ .............................................. G11C 7/00
[52] U.S. Cl. .................................. 365/203; 365/202; 365/204; 365/190
[58] Field of Search ............... 365/203, 204, 189.11, 365/190, 202

[56] References Cited

U.S. PATENT DOCUMENTS

| | | | |
|---|---|---|---|
| 4,802,128 | 1/1989 | Watanabe et al. | 365/203 |
| 4,823,319 | 4/1989 | Pfennings | 365/203 |
| 5,007,023 | 4/1991 | Kim et al. | 365/203 |
| 5,047,984 | 9/1991 | Monden | 365/203 |

*Primary Examiner*—Joseph A. Popek
*Assistant Examiner*—Tan Nguyen
*Attorney, Agent, or Firm*—Sughrue, Mion, Zinn, Macpeak & Seas

[57] ABSTRACT

In a semiconductor static RAM which includes at least one static RAM memory cell connected to a pair of complementary bit lines and each connected to a different word line. A bit line load circuit is connected between the pair of complementary bit lines and a voltage supply potential, and a column selection circuit is connected between the pair of complementary bit lines and a pair of complementary common data bus lines coupled to an input/output data control circuit. The bit line load circuit includes a pair of precharge P-channel insulated gate field effect transistors connected between the voltage supply potential and the pair of complementary bit lines. A bit line equalizing P-channel insulated gate field effect transistor is connected between the pair of complementary bit lines. A gate of each of these P-channel transistors is connected to receive the same internal precharge signal. A pair of bit line level compensating N-channel insulated gate field effect transistors are connected in parallel to the precharge P-channel transistors, respectively, and the gate of each of the pair of bit line level compensating N-channel transistors is connected to the voltage supply potential.

6 Claims, 3 Drawing Sheets

BIT LINE LOAD CIRCUIT FOR SEMICONDUCTOR STATIC RAM

BACKGROUND OF THE INVENTION

1. Field of the invention

The present invention relates to a semiconductor memory circuit, and more specifically to a bit line load circuit for use in a semiconductor static RAM (random access memory).

2. Description of related art

Conventional static RAMs have been composed of a number of complementary bit line pairs, each bit line pair being connected to a bit line load circuit, and also connected through a column selection circuit to a pair of complementary data bus lines which are connected to an input/output data control circuit. To each bit line pair, a number of static RAM memory cells are connected, and the memory cells connected to the same bit line pair are connected to different word lines, respectively.

The bit line load circuit includes a pair of bit line precharge transistors connected between a voltage supply potential and a corresponding pair of bit lines, respectively, and an equalizing transistor connected between the pair of bit lines. A control electrode of the bit line precharge transistors and the equalizing transistor are connected in common to receive the same precharge signal. When the precharge signal is activated, all of the bit line precharge transistors and the equalizing transistor are turned on, so that the pair of bit lines are precharged to the voltage supply potential through the bit line precharge transistors, and the potential of the pair of bit lines are equalized by action of the turned-on equalizing transistor.

Some type of bit line load circuit known to the inventor further includes a pair of bit line level compensating transistors each connected in parallel to a corresponding one of the pair of bit line precharge transistors. These bit line level compensating transistors are formed of a P-channel transistor having its gate connected to the ground, so that the bit line level compensating transistors are ceaselessly maintained in a conductive condition.

In a reading operation, after the pair of bit lines have been precharged to the voltage supply potential during an active period of the precharge signal, the selected word line is activated, so that either one of the pair of bit lines is discharged in accordance with information stored in the selected memory cell. Namely, the potential of the one of the pair of bit lines gradually drops from the voltage supply potential. However, since the bit line level compensating transistors are ceaselessly maintained in the conductive condition, the potential of the one bit line does not drop to the ground level, but the potential drop of the one bit line stops at a predetermined potential. This is to prevent the data held in a memory cell connected to the word line selected in a next reading cycle, from being broken by a potential elevation of the word line selected in that next cycle. In addition, it is effective in speeding up the equalizing operation in a next precharge cycle so that the reading operation can be carried out at a high speed.

Accordingly, after the reading operation has been completed, when the precharge signal is activated again, the bit line precharge transistors and the equalizing transistor are turned on, so that the pair of bit lines are precharged and equalized and are quickly elevated to the voltage supply potential.

In the above mentioned bit line load circuit for the semiconductor static RAM, however, since the bit level compensating transistors are constituted of the P-channel transistor ceaselessly maintained in the conductive condition, the drop speed of the bit line potential in the reading operation is slow, with the result that the total reading speed is low.

SUMMARY OF THE INVENTION

Accordingly, it is an object of the present invention to provide a bit line load circuit which is used for a semiconductor static RAM and which has overcome the defect of the above mentioned bit line load circuit.

Another object of the present invention is to provide a bit line load circuit which is used for a semiconductor static RAM and which is configured to prevent the drop of the reading speed caused by the bit line level compensating transistors.

The above and other objects of the present invention are achieved in accordance with the present invention by a bit line load circuit which is used for a semiconductor static RAM and which includes a precharge P-channel insulated gate field effect transistor connected between a voltage supply potential and a corresponding bit line, a gate of the precharge transistor being connected to receive an internal precharge signal, and a bit line level compensating N-channel insulated gate field effect transistor connected in parallel to the precharge transistor.

In one preferred embodiment, a gate of the bit line level compensating N-channel insulated gate field effect transistor is connected to the voltage supply potential. In another preferred embodiment, the gate of the bit line level compensating N-channel insulated gate field effect transistor is connected to receive the internal precharge signal.

The above and other objects, features and advantages of the present invention will be apparent from the following description of preferred embodiments of the invention with reference to the accompanying drawings.

DESCRIPTION OF THE PREFERRED EMBODIMENTS

Figure 1:
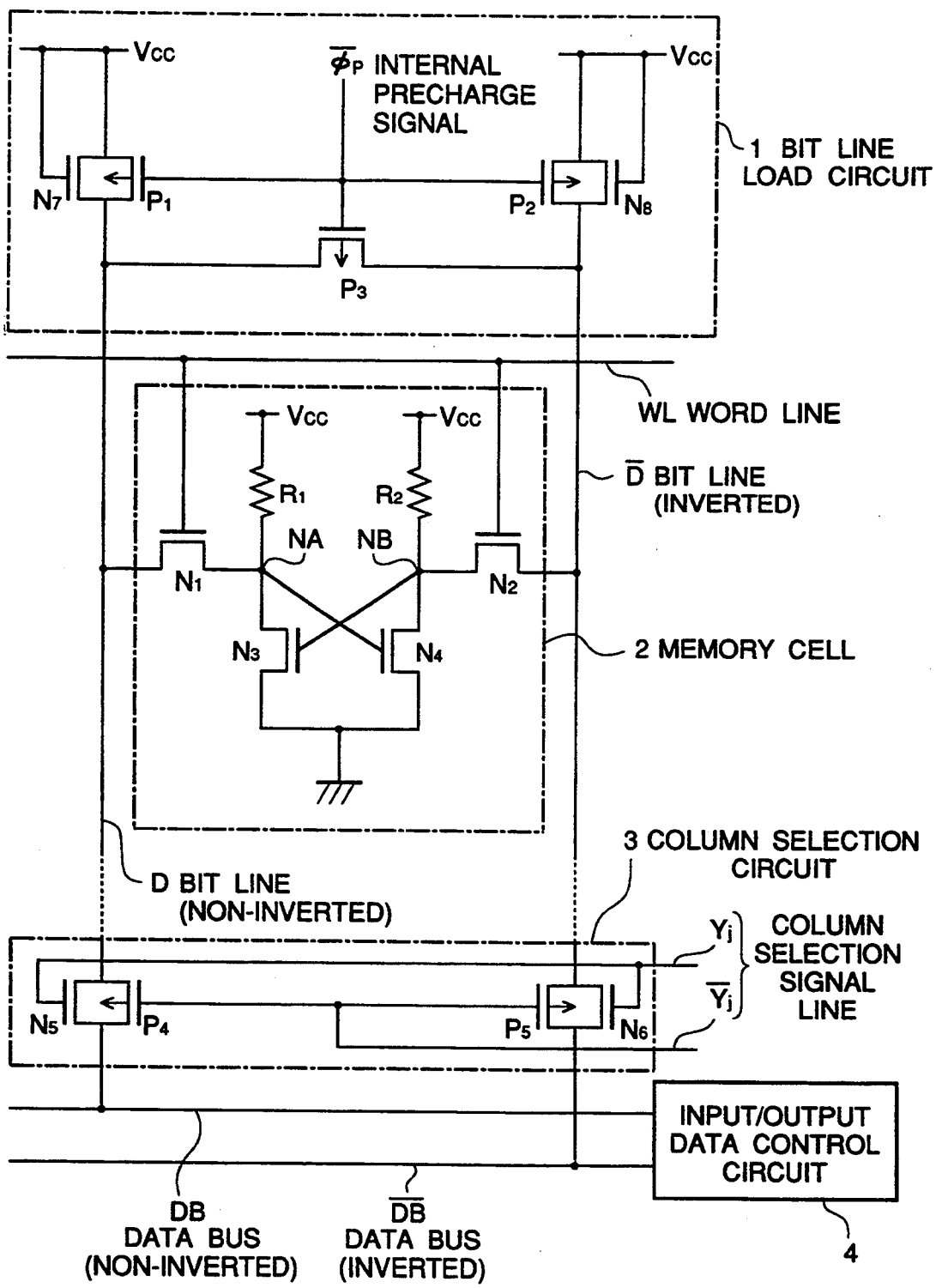
FIG. 1 is a circuit diagram of a first embodiment of the bit line load circuit in accordance with the present invention, incorporated in a semiconductor static RAM.

Referring to FIG. 1, there is shown a circuit diagram of a first embodiment of the bit line load circuit in accordance with the present invention, incorporated in a semiconductor static RAM.

Although a semiconductor static RAM includes a great number of memory cells, only one memory cell and circuits associated thereto are shown in FIG. 1 for simplification of the drawing.

In FIG. 1, one memory cell 2 is connected to a pair of complementary bit lines D and $\overline{D}$, which are in turn connected to a bit line load circuit 1 and also connected through a column selection circuit 3 to a pair of complementary common data bus lines DB and $\overline{DB}$ coupled to an input/output data control circuit 4.

The memory cell 2 includes a pair of switching transistors composed of N-channel insulated gate field effect transistors $N_1$ and $N_2$, which are connected at their one end to corresponding bit lines D and $\overline{D}$, respectively. A gate of each of these switching N-channel transistors $N_1$ and $N_2$ is connected to a corresponding word line WL. The other end of the switching N-channel transistors $N_1$ and $N_2$ are respectively connected to a pair of complementary storage nodes NA and NB, which are in turn connected to a drain of a pair of driving transistors composed of source-grounded N-channel insulated gate field effect transistors $N_3$ and $N_4$. The drain of each of the driving N-channel transistors $N_3$ and $N_4$ is connected to a gate of the other driving N-channel transistor and also connected through a high resistance load $R_1$ or $R_2$ to a voltage supply potential Vcc.

The column selection circuit 3 includes a pair of CMOS transfer gates which are connected between the bit lines and the data bus lines and which are controlled by a pair of complementary column selection signals $Y_j$ and $\overline{Y}_j$. The non-inverted bit line D is connected to the non-inverted data bus line DB through the CMOS transfer gate formed of a P-channel insulated gate field effect transistor $P_4$ and a N-channel insulated gate field effect transistors $N_5$ which are connected in parallel to each other. The inverted bit line $\overline{D}$ is connected to the inverted data bus line $\overline{DB}$ through the CMOS transfer gate formed of a P-channel insulated gate field effect transistor $P_5$ and a N-channel insulated gate field effect transistors $N_6$ which are connected in parallel to each other. A gate of the N-channel transistors $N_5$ and $N_6$ are connected to each other so as to receive the column selection signal $Y_j$, and a gate of the P-channel transistor $P_4$ and $P_5$ are connected to each other so as to receive the inverted column selection signal $\overline{Y}_j$.

The above mentioned structure of the static RAM memory cell 2 and the column selection circuit 3 are well known to persons skilled in the art, and therefore, a further explanation of the construction and a detailed explanation of the operation will be omitted.

The bit line load circuit 1 includes a pair of precharge transistors constituted of enhancement P-channel insulated gate field effect transistors $P_1$ and $P_2$, which have their source connected to the voltage supply potential Vcc and their drain connected to corresponding bit lines D and $\overline{D}$, respectively. The bit line load circuit 1 also includes a bit line equalizing transistor composed of an enhancement P-channel insulated gate field effect transistors $P_3$ connected between the pair of bit lines D and $\overline{D}$. A gate of the precharge P-channel transistors $P_1$ and $P_2$ and the equalizing P-channel transistors $P_3$ are connected to each other so as to receive the same low-active internal precharge signal $\overline{\phi_p}$.

Furthermore, the bit line load circuit 1 includes a pair of bit line level compensating transistors constituted of enhancement N-channel insulated gate field effect transistors $N_7$ and $N_8$, each of which is connected in parallel to a corresponding one of the precharge P-channel transistors $P_1$ and $P_2$. A gate of the bit line level compensating N-channel transistors $N_7$ and $N_8$ are connected to the voltage supply potential Vcc.

Figure 2:
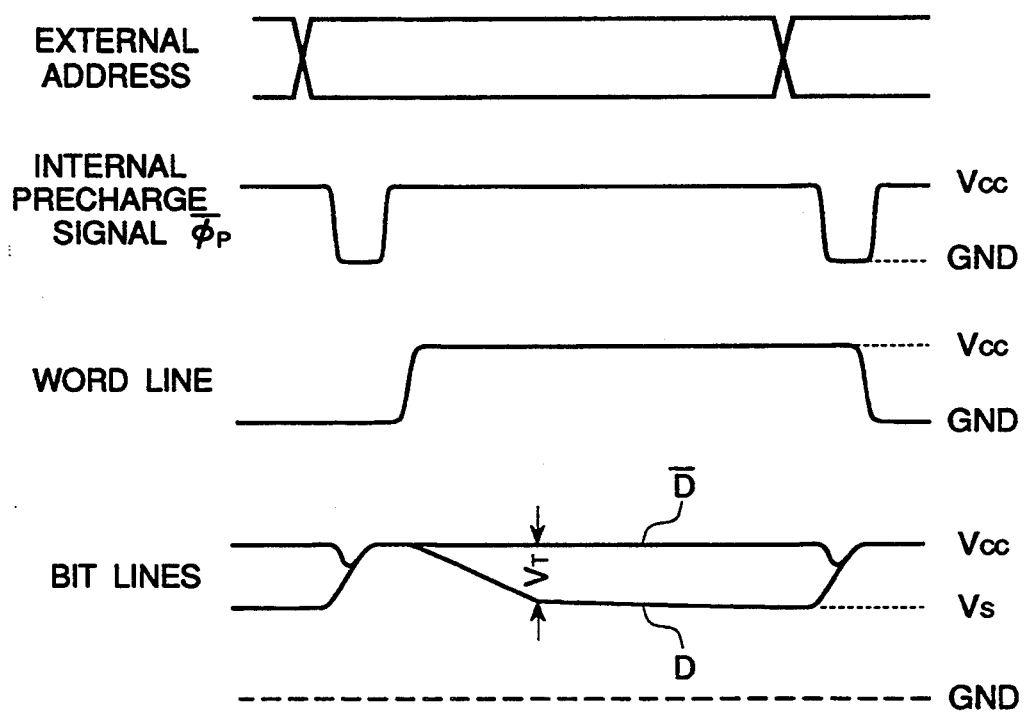
FIG. 2 is a waveform diagram illustrating an operation of the first embodiment of the bit line load circuit in accordance with the present invention.

Now, operation of the static RAM including the shown bit line load circuit will be described, particularly paying attention to the N-channel transistors $N_7$ and $N_8$, and with reference to FIG. 2 illustrating various waveforms at the time of reading the memory cell 2.

If the shown word line WL is selected or activated in accordance with an address signal (not shown in FIG. 1) supplied from an external, the information held on the storage nodes NA and NB of the memory cell 2 are transferred through the switching transistors $N_1$ and $N_2$ to the pair of bit lines D and $\overline{D}$, respectively. In addition, in accordance with the external address signal, the non-inverted column selection signal $Y_j$ is brought to a high level and the inverted column selection signal $\overline{Y}_j$ is brought to a low level, so that the information on the pair of bit lines D and $\overline{D}$ are transferred through the column selection transistors $P_4$, $N_5$, $P_5$ and $N_6$ to the pair of common data bus lines DB and $\overline{DB}$, and furthermore, outputted through the input/output data control circuit 4 to an external terminal (not shown).

In the above mentioned reading cycle, before the potential of the word line WL is elevated as shown in FIG. 2, the pair of bit lines D and $\overline{D}$ are precharged to the voltage supply potential Vcc during a low level period of the low-active precharge signal $\overline{\phi_p}$. Therefore, after the potential of the word line WL is elevated, either one of the pair of bit lines D and $\overline{D}$ thus precharged drops from the voltage supply potential Vcc. In an example shown in FIG. 2, the potential of the bit line D drops.

In this process, assuming that a threshold voltage of the bit line level compensating enhancement N-channel transistors $N_7$ and $N_8$ is VT, these N-channel transistor $N_7$ and $N_8$ are maintained in a non-conductive condition before the potential of the bit lines D and $\overline{D}$ drops to a potential of (Vcc−VT).

Accordingly, the potential of the bit line D drops more quickly than in the static RAM incorporating therein the bit line load circuit as mentioned under "Description of related art", and then, when the potential of the bit line D has dropped to the potential of (Vcc−VT), the N-channel transistor $N_7$ is brought into a conductive condition. Therefore, the potential of the bit line D does not drop to the ground level GND, but finally remains at a predetermined balanced potential Vs.

Thereafter, if the external address changes as shown in FIG. 2, the low-active precharge signal $\overline{\phi_p}$ is brought to the low potential level for a very short period of time, so that the precharge P-channel transistors $P_1$ and $P_2$ and the equalizing P-channel transistor $P_3$ are rendered conductive, and therefore, the bit lines D and $\overline{D}$ are precharged and equalized so as to quickly elevate their potential to the voltage supply potential Vcc, as shown in FIG. 2.

Figure 3:
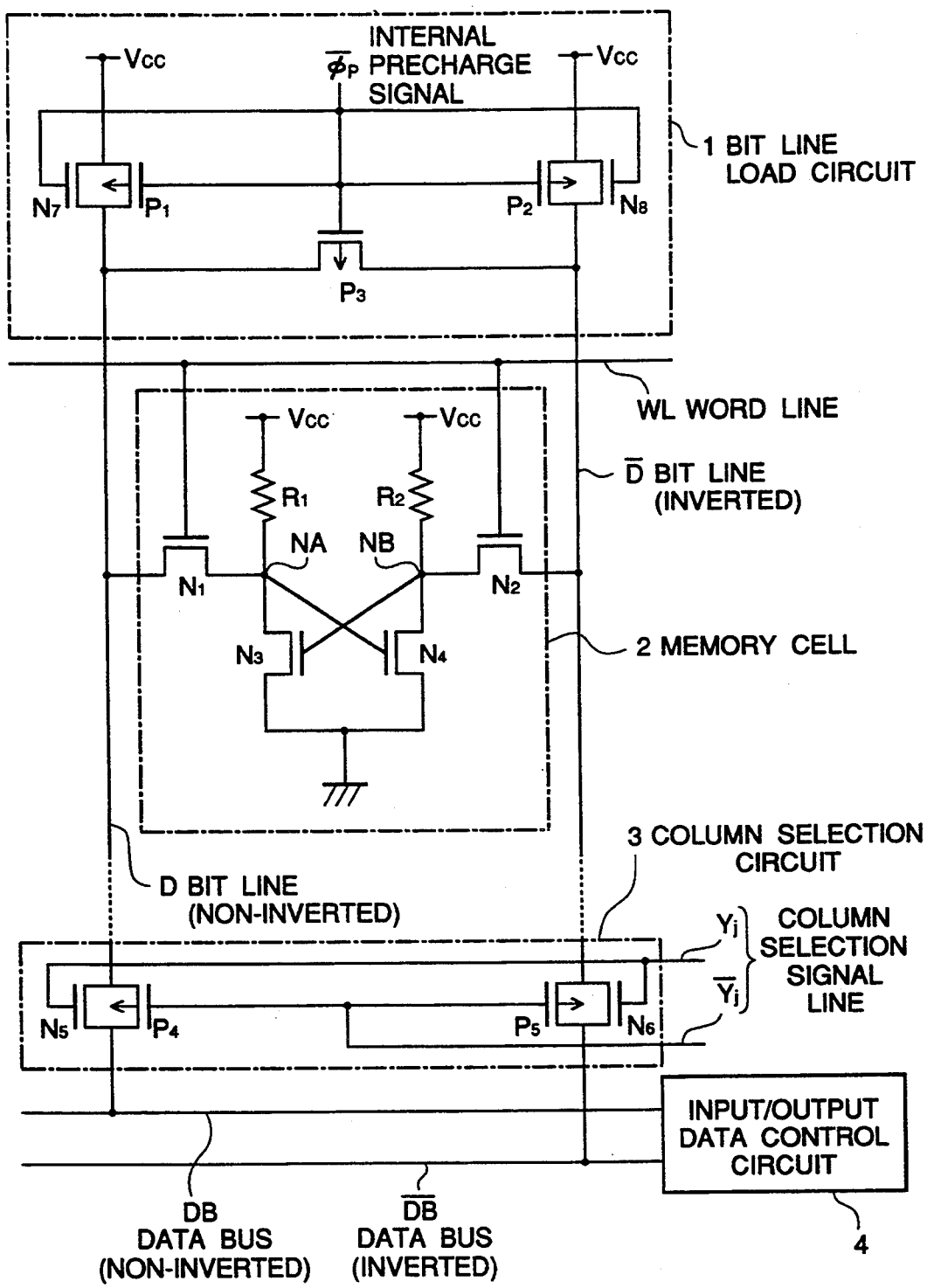
FIG. 3 is a circuit diagram of a second embodiment of the bit line load circuit in accordance with the present invention, incorporated in a semiconductor static RAM.

Referring to FIG. 3, there is shown a modification of the bit line load circuit shown in FIG. 1, incorporated in a semiconductor static RAM. Therefore, in FIG. 3, elements similar or corresponding to those shown in FIG. 1 are given the same Reference Numerals, and explanation thereof will be omitted.

As will be apparent from comparison between FIGS. 1 and 3, the bit line load circuit shown in FIG. 3 is different from the bit line load circuit shown in FIG. 1 only in the point that the gate of the bit line level compensating transistors $N_7$ and $N_8$ are connected to receive the low-active precharge signal $\overline{\phi_p}$.

The precharge signal $\overline{\phi_p}$ is brought to the low level for a very short period of time after the external address signal has changed, but is maintained at the high level during a period after the potential of the word line WL is elevated and in which the data of the memory cell is being transferred to the pair of bit lines D and $\overline{D}$. In the bit line load circuit shown in FIG. 3, therefore, it is apparent that an effect similar to that obtained in the bit line load circuit shown in FIG. 1 can be obtained.

As seen from the above, the bit line load circuit in accordance with the present invention is characterized in that, since the bit line level compensating transistors are constituted of an N-channel transistor, the bit line level compensating transistors are in no way rendered conductive before the potential of the bit line drops to a level lower than the potential of (Vcc−VT). In the reading operation, therefore, the potential of the bit line drops quickly, with the result that the reading operation speed can be increased.

The invention has thus been shown and described with reference to the specific embodiments. However, it should be noted that the present invention is in no way limited to the details of the illustrated structures but changes and modifications may be made within the scope of the appended claims.

I claim:

1. A bit line load circuit which is used for a semiconductor static RAM and which includes a precharge P-channel insulated gate field effect transistor connected between a voltage supply potential and a corresponding bit line, a gate of said precharge transistor being connected to receive an internal precharge signal, and a bit line level compensating N-channel insulated gate field effect transistor connected in parallel to said precharge transistor, wherein a gate of said bit line level compensating N-channel insulated gate field effect transistor is connected to receive said internal precharge signal.

2. In a semiconductor static RAM which at least includes a pair of complementary bit lines, at least one static RAM memory cell connected to said pair of complementary bit lines and each connected to a different word line, a bit line load circuit connected between said pair of complementary bit lines and a voltage supply potential, a column selection circuit connected between said pair of complementary bit lines and a pair of complementary common data bus lines coupled to an input/output data control circuit, said bit line load circuit including a pair of precharge P-channel insulated gate field effect transistors connected between said voltage supply potential and said pair of complementary bit lines, a gate of each of said precharge P-channel transistors being connected to receive an internal precharge signal, and a pair of bit line level compensating N-channel insulated gate field effect transistors each connected in parallel to a corresponding one of said precharge transistors, a gate of each of said pair of bit line level compensating N-channel transistors being connected to receive a predetermined bias voltage at least when said precharge P-channel transistors are off, wherein the gate of each of said pair of bit line level compensating N-channel transistors is connected to receive said internal precharge signal.

3. A bit line load circuit claimed in claim 2 wherein said bit line load circuit further includes a bit line equalizing P-channel insulated gate field effect transistor connected between said pair of complementary bit lines.

4. A semiconductor memory comprising:
a bit line;
a first transistor having one end, another end, and a gate, wherein said one end of said first transistor is connected to said bit line, said another end of said first transistor is connected to a voltage supply voltage, and said gate of said first transistor is connected to receive a control signal, and wherein said first transistor is turned on in response to a first level of said control signal at a first timing so as to charge said bit line, and said first transistor is turned off in response to a second level of said control signal, which is opposite to said first level of said control signal, at a second timing after said first timing;
a memory cell connected to said bit line for selectively discharging said bit line in accordance with data held in said memory cell in response to said control signal at said second timing; and
a second transistor having one end, another end, and a gate, wherein said one end of said second transistor is connected to said bit line, said other end of said second transistor is connected to a fixed voltage point, and said gate of said second transistor receives a predetermined voltage so that said second transistor is turned off in accordance with a potential of said bit line charged at said first timing, and said second transistor is turned on at said second timing after said potential of said bit line has been discharged by said data of said memory cell.

5. A semiconductor memory claimed in claim 4 wherein said first transistor is a P-channel transistor, and said second transistor is an N-channel transistor.

6. A semiconductor memory claimed in claim 4 wherein said voltage supply voltage, said fixed voltage point, and said predetermined voltage are the same.

* * * * *

UNITED STATES PATENT AND TRADEMARK OFFICE
CERTIFICATE OF CORRECTION

PATENT NO. : 5,418,748
DATED : May 23, 1995
INVENTOR(S) : Junji MONDEN

It is certified that errors appears in the above-identified patent and that said Letters Patent is hereby corrected as shown below:

Col. 4, line 34, delete "VT", insert --$V_T$-- p. 8, line 2.

Col. 4, line 36, delete "VT", insert --$V_T$-- p. 8, line 4.

Col. 4, line 42, delete "VT", insert --$V_T$-- p. 8, line 8.

Col. 5, line 16, delete "VT", insert --$V_T$-- p. 7 line 16.

Signed and Sealed this

Tenth Day of October, 1995

*Attest:*

BRUCE LEHMAN

*Attesting Officer*     *Commissioner of Patents and Trademarks*